United States Patent
Wang et al.

(10) Patent No.: US 12,432,932 B2
(45) Date of Patent: Sep. 30, 2025

(54) SEMICONDUCTOR STRUCTURE AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Xiaoguang Wang, Hefei (CN); Dinggui Zeng, Hefei (CN); Huihui Li, Hefei (CN); Kanyu Cao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

(*) Notice: Subject to any disclaimer, the term of this patent is extended or adjusted under 35 U.S.C. 154(b) by 674 days.

(21) Appl. No.: 17/808,382

(22) Filed: Jun. 23, 2022

(65) Prior Publication Data
US 2023/0067509 A1   Mar. 2, 2023

Related U.S. Application Data (63) Continuation of application No. PCT/CN2022/077806, filed on Feb. 25, 2022.

(30) Foreign Application Priority Data

Sep. 1, 2021   (CN) .......................... 202111020119.1

(51) Int. Cl.
| | |
|---|---|
| H10B 61/00 | (2023.01) |
| H10D 30/67 | (2025.01) |
| H10D 99/00 | (2025.01) |
| H10N 50/01 | (2023.01) |

(52) U.S. Cl.
CPC ......... *H10B 61/22* (2023.02); *H10D 30/6728* (2025.01); *H10D 30/6755* (2025.01); *H10D 99/00* (2025.01); *H10N 50/01* (2023.02)

(58) Field of Classification Search
CPC ............................ H10B 61/22; H10D 30/6728
See application file for complete search history.

(56) References Cited

U.S. PATENT DOCUMENTS

| 8,830,735 B2 | 9/2014 | Kariyada et al. |
| 9,117,749 B1 | 8/2015 | Or-Bach et al. |

(Continued)

FOREIGN PATENT DOCUMENTS

| CN | 102479541 A | 5/2012 |
| CN | 109461756 A | 3/2019 |

(Continued)

OTHER PUBLICATIONS

International Search Report cited in PCT/CN2022/077806 mailed May 19, 2022, 9 pages.

(Continued)

*Primary Examiner* — Shih Tsun A Chou
(74) *Attorney, Agent, or Firm* — Kilpatrick Townsend & Stockton LLP (57) ABSTRACT

The present disclosure provides a semiconductor structure and a manufacturing method thereof. The semiconductor structure includes a substrate. A plurality of vertical transistors arranged in an aligned manner are formed on the substrate, wherein a channel material of the vertical transistor includes an oxide semiconductor. A plurality of staggered contact pads connected to upper ends of the vertical transistors are formed on the vertical transistors, wherein a single contact pad is connected to the upper ends of an even number of vertical transistors. A magnetic tunnel junction is formed on the contact pad.

7 Claims, 7 Drawing Sheets

(56) References Cited

U.S. PATENT DOCUMENTS

| | | | |
|---|---|---|---|
| 10,297,290 | B1 | 5/2019 | Beigel et al. |
| 10,446,606 | B2 | 10/2019 | Kumar et al. |
| 11,127,783 | B2 | 9/2021 | Zhu et al. |
| 2007/0080385 | A1 | 4/2007 | Kim et al. |
| 2010/0059837 | A1 | 3/2010 | Kim et al. |
| 2010/0289084 | A1 | 11/2010 | Yoon et al. |
| 2011/0215382 | A1 | 9/2011 | Asao et al. |
| 2014/0138609 | A1 | 5/2014 | Satoh et al. |
| 2016/0043136 | A1 | 2/2016 | Kim et al. |
| 2020/0144330 | A1 | 5/2020 | Majhi et al. |
| 2022/0052115 | A1* | 2/2022 | Wang .................. H10B 63/84 |

FOREIGN PATENT DOCUMENTS

| | | |
|---|---|---|
| CN | 110571261 A | 12/2019 |
| CN | 110892531 A | 3/2020 |
| CN | 111816673 A | 10/2020 |
| CN | 212136451 U | 12/2020 |
| CN | 212391999 U | 1/2021 |
| CN | 112349322 A | 2/2021 |
| WO | 2017052542 A1 | 3/2017 |
| WO | 2018182724 A1 | 10/2018 |

OTHER PUBLICATIONS

International Search Report cited in PCT/CN2022/077730 mailed Apr. 25, 2022, 9 pages.
International Search Report cited in PCT/CN2022/077805 mailed May 11, 2022, 8 pages.

\* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/077806, filed on Feb. 25, 2022, which claims the priority to Chinese Patent Application No. 202111020119.1, titled "SEMICONDUCTOR STRUCTURE AND MANUFACTURING METHOD THEREOF" and filed with China National Intellectual Property Administration (CNIPA) on Sep. 1, 2021. The entire contents of International Application No. PCT/CN2022/077806 and Chinese Patent Application No. 202111020119.1 are incorporated herein by reference.

TECHNICAL FIELD

The present disclosure relates to the technical field of semiconductors, and in particular, to a semiconductor structure and a manufacturing method thereof.

BACKGROUND

A magnetoresistive random access memory (MRAM) has the high read and write capability of a static random access memory and the high integration degree of a dynamic random access memory. Besides, data can be infinitely repeatedly written into a magnetoresistive random access memory.

At present, a magnetic tunnel junction (MTJ) is combined with a transistor to increase the capacity of an MRAM, so that the capacity of the MRAM is increased from the MB level to the GB level.

However, a drive current of a transistor is small. As a result, it is difficult for a transistor to drive an MRAM memory array.

SUMMARY

An embodiment of the present disclosure provides a semiconductor structure, including:
  a substrate;
  a plurality of vertical transistors arranged in an aligned manner on the substrate; where a channel material of the vertical transistor includes an oxide semiconductor;
  a plurality of staggered contact pads connected to upper ends of the vertical transistors, wherein a single contact pad is connected to the upper ends of an even number of vertical transistors; and
  a magnetic tunnel junction is arranged on the contact pad.

Another embodiment of the present disclosure provides a method of manufacturing a semiconductor structure, including:
  providing a substrate and forming a plurality of vertical transistors in an aligned manner on the substrate; wherein a channel material of the transistor includes an oxide semiconductor;
  forming a plurality of staggered contact pads connected to upper ends of the vertical transistors, where a single contact pad is connected to upper ends of an even number of vertical transistors; and
  forming a magnetic tunnel junction on the contact pad.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and a person of ordinary skill in the art may still derive other drawings from these drawings without creative efforts.

DETAILED DESCRIPTION

To make the objectives, technical solutions, and advantages of the present disclosure clearer, the following clearly and completely describes the technical solutions in the present disclosure with reference to the accompanying drawings in the present disclosure. Apparently, the described embodiments are some but not all of the embodiments of the present disclosure. All other embodiments obtained by those of ordinary skill in the art based on the embodiments of the present disclosure without creative efforts should fall within the protection scope of the present disclosure.

At present, a magnetic tunnel junction (MTJ) is combined with a transistor to increase the capacity of an MRAM, so that the capacity of the MRAM is increased from the MB level to the GB level. That is, the MRAM is improved to form a spin-transfer torque magnetoresistive random access memory (STT-MRAM). The STT-MRAM a novel nonvolatile magnetic memory that writes information through a spin current and includes a magnetic tunnel junction and a transistor. The magnetic tunnel junction includes a pinned layer, an insulating layer, and a free layer that are stacked in sequence. A magnetization direction of the pinned layer is fixed, while a magnetization direction of the free layer is easily changed under the action of a magnetic field or a spin-polarized current. A drain electrode of the transistor is connected to one end of the magnetic tunnel junction, such as the pinned layer of the magnetic tunnel junction, and the other end of the magnetic tunnel junction is connected to a bit line. When the transistor is turned on, the source electrode and the drain electrode of the transistor, the magnetic tunnel junction, and the bit line form a loop.

When a current flows from the pinned layer into the free layer, electrons whose spin direction is consistent with the magnetization direction of the pinned layer are more likely to pass through the pinned layer, so that after the electrons pass through the pinned layer, polarized electrons whose spin direction is consistent with the magnetization direction of the pinned layer are generated. When the spin-polarized electrons pass through the pinned layer and reach the free layer, electrons whose spin direction is consistent with the magnetization direction of the free layer enter the free layer, and generate a torque on a magnetic moment of the free layer. The torque drives the magnetization direction of the free layer to rotate to a direction in parallel with that of the pinned layer. At the same time, electrons whose spin direction is opposite to the magnetization direction of the free layer are reflected back to the pinned layer, and generate a torque that attempts to rotate the magnetization direction of the pinned layer. However, the torque cannot rotate the magnetization direction of the pinned layer and finally, the magnetization direction of the free layer and the magnetization direction of the pinned layer are in parallel with each other. A resistance of the magnetic tunnel junction is small and the STT-MRAM completes writing information "0".

When a current flows from the free layer to the pinned layer, electrons whose spin direction is consistent with the magnetization direction of the free layer are more likely to pass through the free layer, so that after the electrons pass through the free layer, polarized electrons whose spin direction is consistent with the magnetization direction of the free layer are generated. When the spin-polarized electrons pass through the free layer and reach the pinned layer, electrons whose spin direction is consistent with the magnetization direction of the pinned layer enter the pinned layer and generate a torque on a magnetic moment of the pinned layer. The torque cannot rotate the magnetization direction of the pinned layer. Electrons whose spin direction is opposite to the magnetization direction of the pinned layer are reflected back to the free layer, and generate a torque that rotates the magnetization direction of the free layer. The torque drives the magnetization direction of the free layer to rotate to a direction in antiparallel with that of the pinned layer, and finally the magnetization direction of the free layer is in antiparallel with the magnetization direction of the pinned layer. A resistance of the magnetic tunnel junction is large and the STT-MRAM completes writing information "1".

According to the information writing method of the STT-MRAM, a magnetic field is generated through a current, so that the magnetic moment of the free layer is reversed, and the resistance of the magnetic tunnel junction is changed to implement information writing. During information writing, a large current is required to generate a magnetic field, so that the magnetic moment of the free layer of the magnetic tunnel junction is reversed. As a size of a memory cell decreases, a larger magnetic field is required to reverse the magnetic moment of the free layer. Therefore, a larger drive current is required. However, currently, a drive current of a transistor is small. As a result, it is difficult for the transistor to drive an MRAM memory array.

Therefore, the present disclosure provides a semiconductor structure, including a plurality of vertical transistors arranged in an aligned manner on a substrate, where the channel material of the vertical transistor includes an oxide semiconductor. A plurality of staggered contact pads connected to upper ends of the vertical transistors are formed at the upper ends of the vertical transistors, where a single contact pad is connected to upper ends of an even number of vertical transistors. Magnetic tunnel junctions are formed on the contact pads. A plurality of vertical transistors are connected to a single contact pad, that is, a plurality of vertical transistors are connected to one magnetic tunnel junction through the contact pad, and one magnetic tunnel junction is driven by the plurality of vertical transistors, thereby increasing a drive current for driving the magnetic tunnel junction and effectively driving a memory array of a magnetoresistive random access memory.

The technical solution of the present disclosure will be described in detail below with reference to specific embodiments. The following specific embodiments may be combined with each other, and the same or similar concepts or processes may not be repeatedly described in some embodiments.

Figure 16:
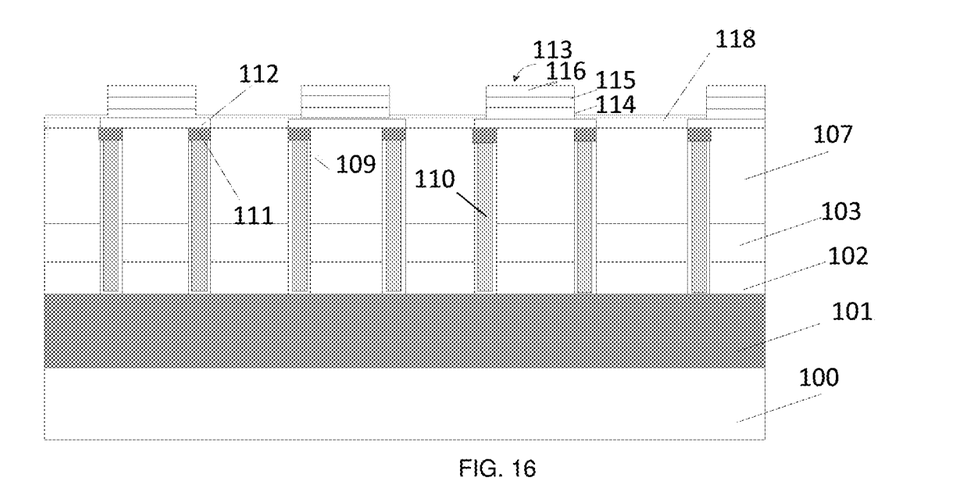
FIG. 16 is a schematic structural cross-sectional diagram of a semiconductor structure according to an embodiment of the present disclosure.
Figure 17:
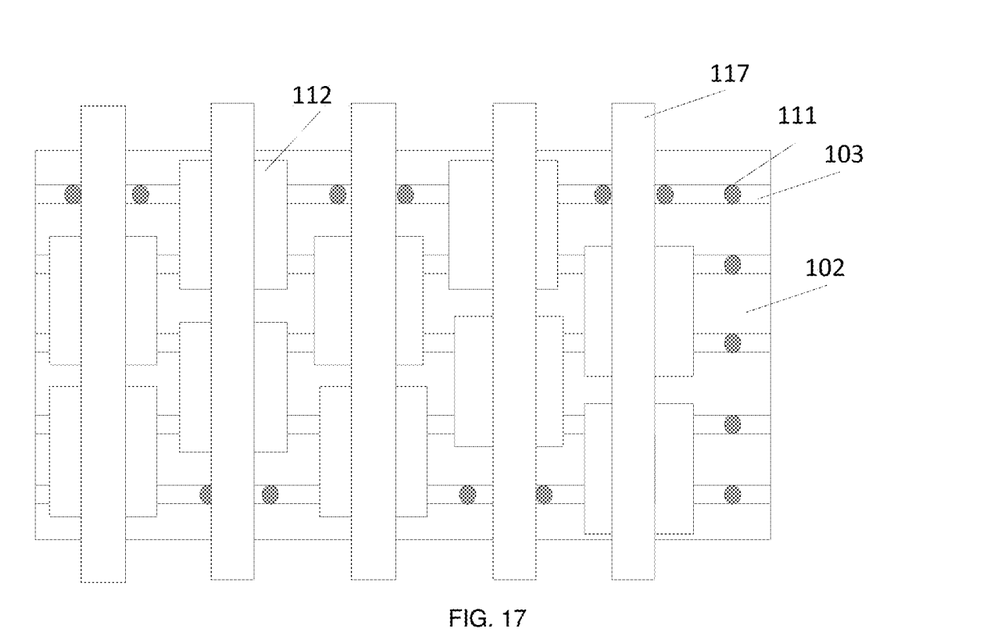
FIG. 17 is a schematic structural top view of a semiconductor structure according to an embodiment of the present disclosure.

An embodiment of the present disclosure provides a semiconductor structure, as shown in FIG. 16 and FIG. 17, including:
  a substrate 100;
  a plurality of vertical transistors arranged in an aligned manner on the substrate 100; where a channel material of the vertical transistor includes an oxide semiconductor;
  a plurality of staggered contact pads 112 connected to upper ends of the vertical transistors, where a single contact pad 112 is connected to upper ends of an even number of vertical transistors; and
  magnetic tunnel junctions 113 on the contact pads 112.

In this embodiment of the present disclosure, the substrate 100 is a semiconductor substrate, for example, may be a Si substrate, a Ge substrate, a SiGe substrate, a Silicon on insulator (SOI) substrate, or a Germanium on insulator (GOI). In other embodiments, the semiconductor substrate may also include a semiconductor substrate of other elements or a compound semiconductor substrate, for example, GaAs, InP, or SiC. The semiconductor substrate may also be a laminated structure, for example, Si/SiGe. The semiconductor substrate may also be another epitaxial structure, for example, Silicon Germanium on insulator (SGOI). In this embodiment, the substrate 100 may be a monocrystalline silicon substrate, configured to support a device structure thereon.

A plurality of vertical transistors arranged in an aligned manner are formed on the substrate 100. Referring to FIG. 16, for ease of description, an end of the vertical transistor in contact with the substrate 100 is referred to as a lower end of the vertical transistor, and an end opposite to the lower end is referred to as an upper end of the vertical transistor. Arranging the plurality of vertical transistors in an alignment manner means that upper ends of the vertical transistors are on the same horizontal plane.

Figure 12:
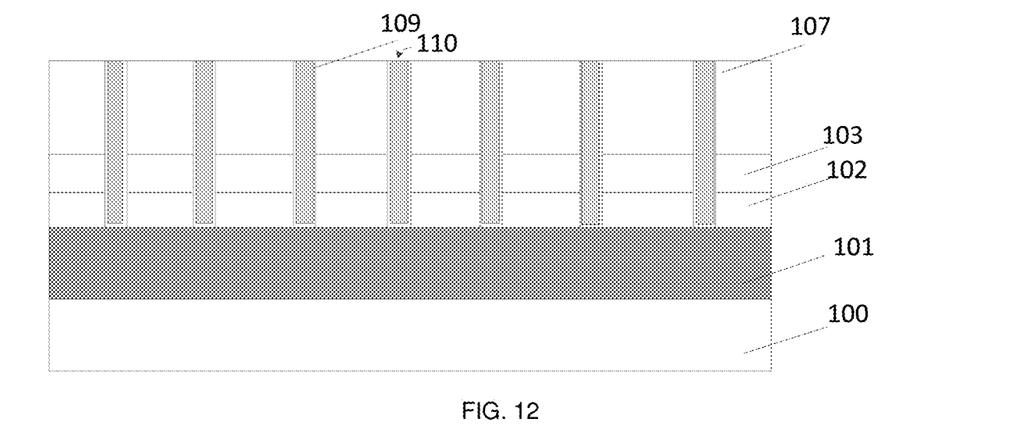

The vertical transistor includes a source electrode, a drain electrode, a gate electrode, and a channel. The plurality of vertical transistors can share a source plate 101 to simplify the manufacturing process. Specifically, as shown in FIG. 12, the source plate 101 is formed on the substrate 100, and the source plate 101 is a source electrode of each vertical transistor. A material of the source plate 101 may be indium tin oxide (ITO), molybdenum (Mo), aluminum (Al), titanium aluminum alloy (Ti/Al), or the like.

An isolation layer 102 is formed on the source plate 101, a word line 103 is formed on the isolation layer 102, the isolation layer 102 isolates the source plate 101 from the word line 103, and a material of the isolation layer 102 can be silicon oxide.

Figure 13:
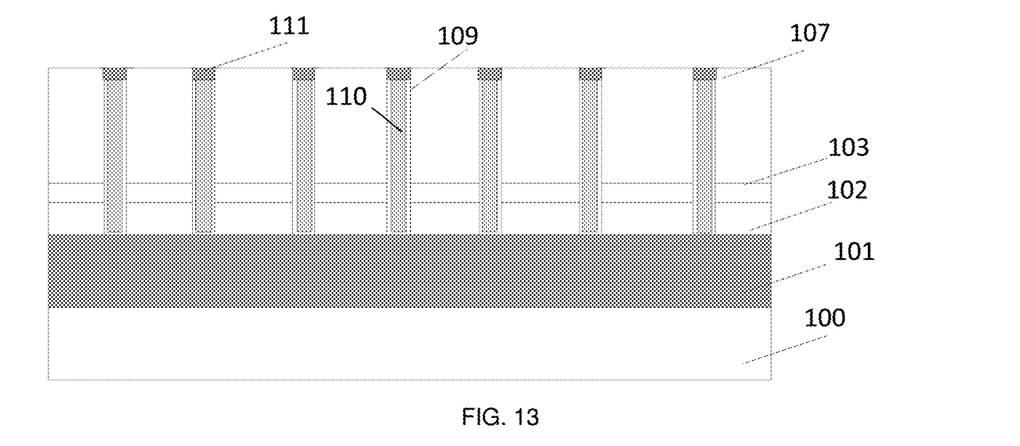

In this embodiment, a plurality of word lines 103 arranged at intervals may be formed on the isolation layer 102, and an interval between adjacent word lines 103 may be determined according to actual needs. A plurality of channels 110 are formed in each word line 103. Referring to FIG. 13, the plurality of channels 110 all pass through the word line 103 to the source plate 101. A material of the channel 110 may include an oxide semiconductor to improve the conductivity of the source plate 101. The oxide semiconductor can be, for example, indium gallium zinc oxide, so as to reduce a temperature in a formation process of the channel 110 and increase a ratio between currents when the channel 110 is opened and closed. For example, the temperature in the formation process of the channel 110 is lower than 300° C., and the ratio between currents when the channel 110 is opened and closed is greater than $10^8$. Meanwhile, since the indium gallium zinc oxide can be grown on any surface as required, when the indium gallium zinc oxide is used as a channel material, the channel 110 can extend from two-dimensional directions to three-dimensional directions. A drain electrode 111 is formed on each channel 110.

Referring to FIG. 16, in this case, a channel 110, a word line 103 of the channel 110, the source plate 101, and the drain electrode 111 on the channel 110 form a vertical transistor. The word line 103 of the channel 110 is a gate electrode of the vertical transistor. Obviously, since a plurality of word lines 103 are formed on the source plate 101 and a plurality of channels 110 are formed in one word line 103, a plurality of vertical transistors can be formed on the substrate 100, and the plurality of vertical transistors are in a honeycomb array.

An end of the channel 110 in contact with the source plate 101 is called a bottom end of the channel 110, and an end opposite to the bottom end is called a top end of the channel 110. The drain electrode 111 of the vertical transistor is formed at the top end of the channel 110. A gate oxide layer 109 is formed between the channel 110 and the word line 103 and between the channel 110 and the source plate 101. The gate oxide layer 109 surrounds the channel 110, and a height of the gate oxide layer 109 is the same as that of the channel 110. Referring to FIG. 13, a material of the gate oxide layer 109 may include a high-k oxide such as Hafnium dioxide ($HfO_2$), Zirconium dioxide ($ZrO_2$), or Hafnium oxynitride (HfON).

Figure 14:
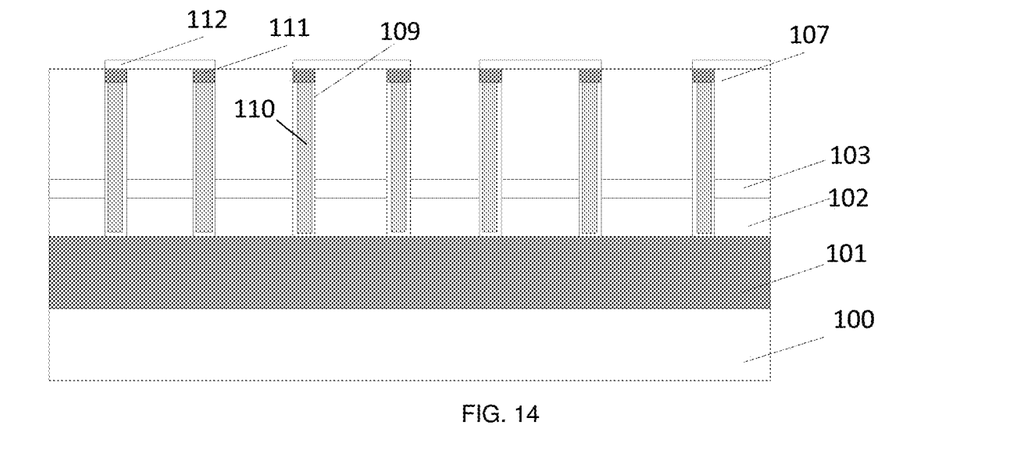
Figure 15:
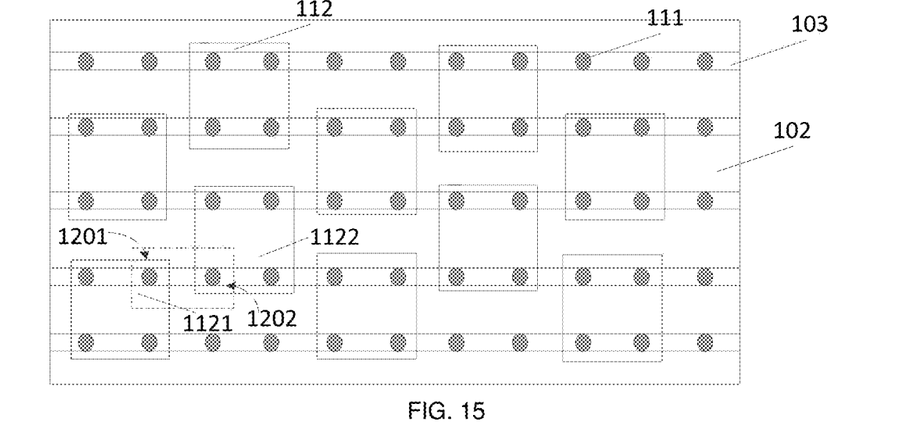
FIG. 15 is a schematic structural top view of a semiconductor structure according to an embodiment of the present disclosure.

A plurality of staggered contact pads 112 are formed at upper ends of the vertical transistors. A number of the contact pads 112 is an even number, so that a shape of the contact pads 112 is a relatively regular square, which reduces the possibility of contact between adjacent contact pads 112 and improves device performance. Referring to FIG. 14 and FIG. 15, FIG. 14 is a schematic structural cross-sectional diagram of a semiconductor structure, and FIG. 15 is a schematic structural top view of a semiconductor structure. A plurality of columns of contact pads 112 are formed on the vertical transistors, and each column includes a plurality of contact pads 112. Contact pads 112 in adjacent columns do not overlap with each other.

For example, a plurality of columns of contact pads are formed on the vertical transistors, for example, including a first column, a second column, and a third column. In this case, contact pads 112 of the first column and the second column are arranged in a staggered manner, and contact pads 112 of the second column and the third column are arranged in a staggered manner. Accordingly, contact pads 112 of the first column and the third column may overlap with each other, that is, the contact pads 112 of the first column and the third column may be on the same horizontal plane.

A number of vertical transistors and a number of contact pads 112 can be determined according to actual situations, which are not limited herein. For example, a single contact pad 112 may be formed at upper ends of four vertical transistors, that is, the single contact pad 112 is connected to the upper ends of the four vertical transistors.

The single contact pad 112 can be connected to two word lines 103 through the four vertical transistors, so that a shape of the contact pad 112 is quadrangular, to facilitate subsequent connection to a bit line. The two word lines 103 may be adjacent word lines, so that the shape of the contact pad 112 is a rectangle, as shown in FIG. 15. Specifically, two of the four vertical transistors are connected to one word line 103, and the other two vertical transistors are connected to another word line 103. Since the four vertical transistors are rectangular, the shape of the contact pad 112 connected to the four vertical transistors may be rectangular.

A direction in which the word line 103 extends is referred to as a first direction, that is, the word line 103 extends in the first direction. In the first direction, a plurality of vertical transistors connected to a same word line are connected to different contact pads 112, and adjacent contact pads 112 are located on two sides of the word line 103 in a staggered manner. For example, two vertical transistors connected to a same word line are connected to two contact pads 112. Referring to a dashed area in FIG. 15, two contact pads 112 in a dashed area are referred to as a first contact pad 1121 and a second contact pad 1122, and two vertical transistors are referred to as a first vertical transistor 1201 and a second vertical transistor 1202. Then, the first vertical transistor 1201 is connected to the first contact pad 1121, the second vertical transistor 1202 is connected to the second contact pads 1122, and the first contact pad 1121 and the second contact pad 1122 are located on two sides of the word line 103 in a staggered manner.

Projections of sides of adjacent staggered contact pads 112 on the word line 103 are located on a same straight line, which reduces a size of the contact pad 112 and costs. When the projections of the sides of the adjacent staggered first contact pads 1121 and second contact pads 1122 on the word line 103 are located on the same straight line, the first contact pad 1121 may be connected to a part of the first vertical transistor 1201, and the second contact pad 1122 may be connected to a part of the second vertical transistor 1202. When an area of an upper end surface of the first vertical transistor 1201 is equal to that of an upper end surface of the second vertical transistor 1202, a sum of an area of a part of the first vertical transistor 1201 that the first contact pad 1121 is connected to and an area of a part of the second vertical transistor 1202 that the second contact pad 1122 is connected to can be equal to the area of the upper end surface of the first vertical transistor 1201. For example, the first contact pad 1121 is connected to a half of the upper end surface of the first vertical transistor 1201 and the second contact pad 1122 is connected to a half of the upper end surface of the second vertical transistor 1202. In this case, the first contact pad 1121 and the second contact pad 1122 can be formed by using a same mask pattern, which simplifies the process.

A projection of the contact pad 112 on the surface of the substrate 100 covers those of the vertical transistors connected to the contact pad 112 on the surface of the substrate 100. In this case, an area of a single contact pad 112 formed on a plurality of vertical transistors is greater than or equal to that of the plurality of vertical transistors, so that the contact pad 112 can cover the plurality of vertical transistors connected to the contact pad 112, thereby effectively connecting the plurality of vertical transistors together.

Figure 18:
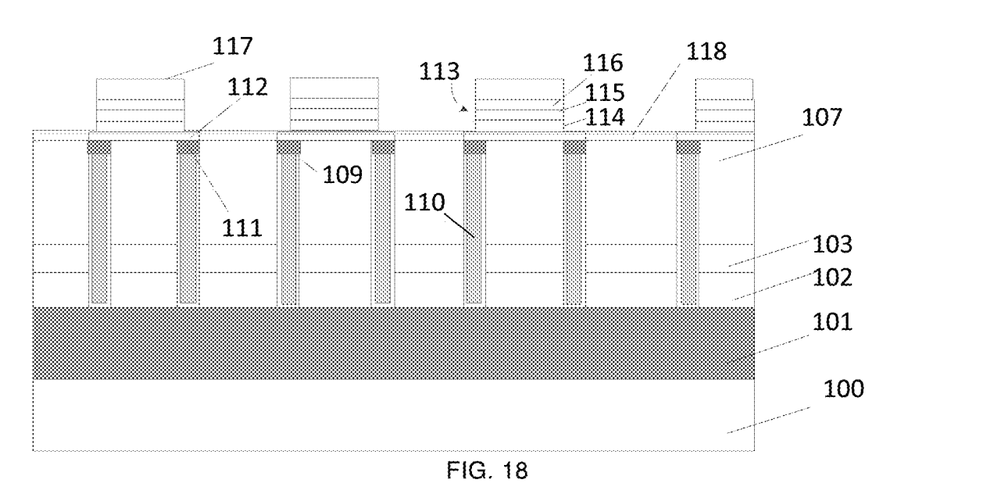
FIG. 18 is a schematic structural cross-sectional diagram of a semiconductor structure according to an embodiment of the present disclosure.

A magnetic tunnel junction 113 is arranged on the contact pad 112. Referring to FIG. 16 to FIG. 18, FIG. 16 is a schematic structural cross-sectional diagram of a semiconductor structure, FIG. 17 is a schematic structural top view of a semiconductor structure, and FIG. 18 is a schematic structural cross-sectional diagram of a semiconductor structure. The magnetic tunnel junction 113 includes a pinned layer 114, an insulating layer 115, and a free layer 116 that are stacked in sequence. The insulating layer 115 functions to isolate the pinned layer 114 from the free layer 116. When magnetization directions of the pinned layer 114 and the free layer 116 are the same, the magnetic tunnel junction 113 is in a low resistance state. When the magnetization directions of the pinned layer 114 and the free layer 116 are opposite to each other, the magnetic tunnel junction 113 is in a high resistance state. Materials of the pinned layer 114 and the free layer 116 can be the same or different, for example, may be iron (Fe), cobalt (Co), nickel (Ni), or alloys thereof. Thicknesses of the pinned layer 114 and the free layer 116 may be the same or different, sizes of the pinned layer 114 and the free layer 116 may be the same or different, and shapes of the pinned layer 114 and the free layer 116 may be the same or different, for example, may be cylindrical or square columnar.

A plurality of bit lines 117 may also be formed on the magnetic tunnel junction 113 to alleviate the problem of a high resistance of buried bit lines. The extension direction of the word line 103 is referred to as a first direction, and the extension direction of the bit line 117 is referred to as a second direction. In this case, a plurality of bit lines 117 extending in the second direction are formed on the magnetic tunnel junction 113, each bit line 117 may be connected to a plurality of magnetic tunnel junctions 113, and the first direction and the second direction may be perpendicular to each other. Then, site selection is performed for the word line 103 and a voltage is applied to the bit line 117, and the magnetization direction of the free layer 116 is reversed by using the writing method of a spin transfer torque (STT), so as to implement writing of the magnetoresistive random access memory.

In the semiconductor structure provided by the present disclosure, a plurality of staggered contact pads connected to upper ends of the vertical transistors are formed on the vertical transistors, where a single contact pad is connected to upper ends of an even number of vertical transistors. A magnetic tunnel junction is driven by a plurality of transistors to increase a drive current for driving the magnetic tunnel junction and effectively drive a memory array of a magnetoresistive random access memory.

An embodiment of the present disclosure further provides a method of manufacturing a semiconductor structure, including:

S101: Provide a substrate 100 and form a plurality of vertical transistors in an aligned manner on the substrate 100; where a channel material of the transistor includes an oxide semiconductor.

Figure 1:
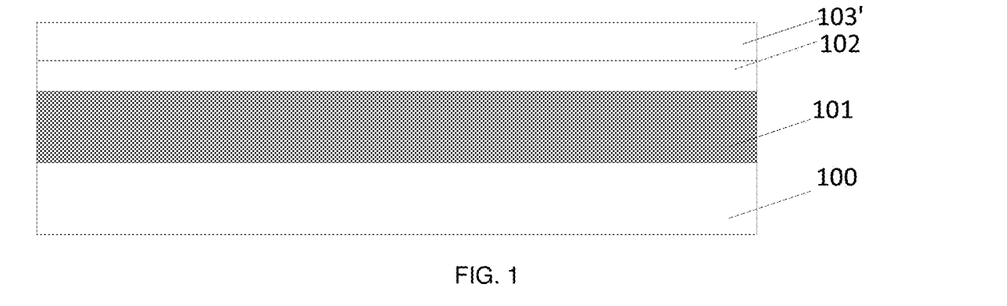
FIG. 1 to FIG. 14 are schematic structural cross-sectional diagrams of a semiconductor structure according to an embodiment of the present disclosure.

Referring to FIG. 1, a substrate 100 is a semiconductor substrate, a source plate 101 is formed on the substrate 100, and an isolation layer 102 is formed on the source plate 101. Specifically, a conductive material is deposited on the substrate 100 through atomic layer deposition (ALD) or chemical vapor deposition (CVD), for example, may be Indium Tin oxide (ITO), Molybdenum (Mo), Aluminum (Al), or Titanium Aluminum alloy (Ti/Al). A planarization process is performed on the deposited conductive material to form the source plate 101 on the substrate 100. Then, a dielectric material such as silicon oxide or silicon nitride is deposited on the source plate 101, and a planarization process is performed on the deposited dielectric material to form an isolation layer 102 on the source plate 101.

Then, word lines 103 arranged at intervals are formed on the isolation layer 102. First, a metal material such as tungsten (W) or molybdenum (Mo) is deposited on the isolation layer 102, and a planarization process is performed on the metal material to form an initial word line layer 103' on the isolation layer 102, as shown in FIG. 1.

Figure 2:
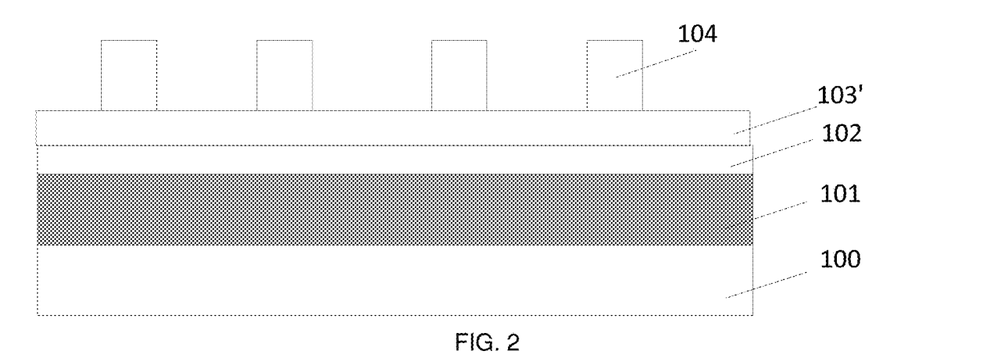
Figure 3:
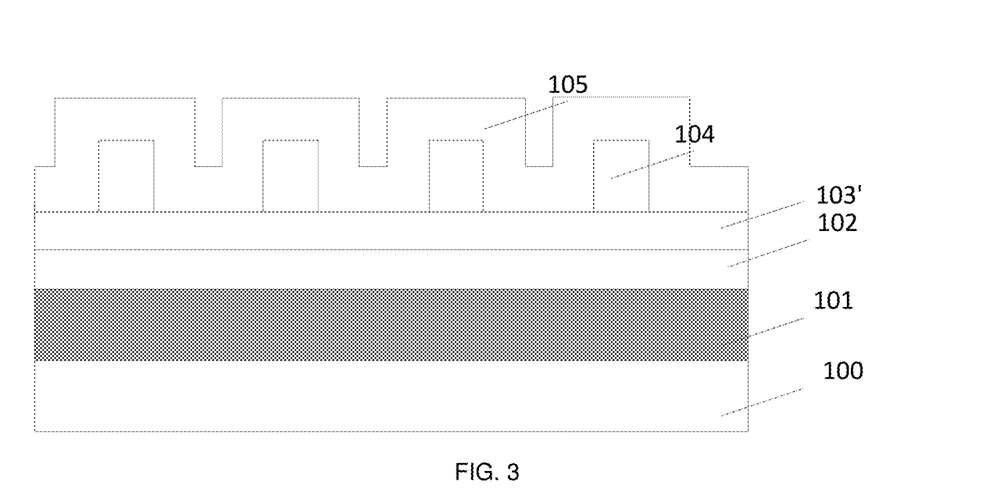
Figure 4:
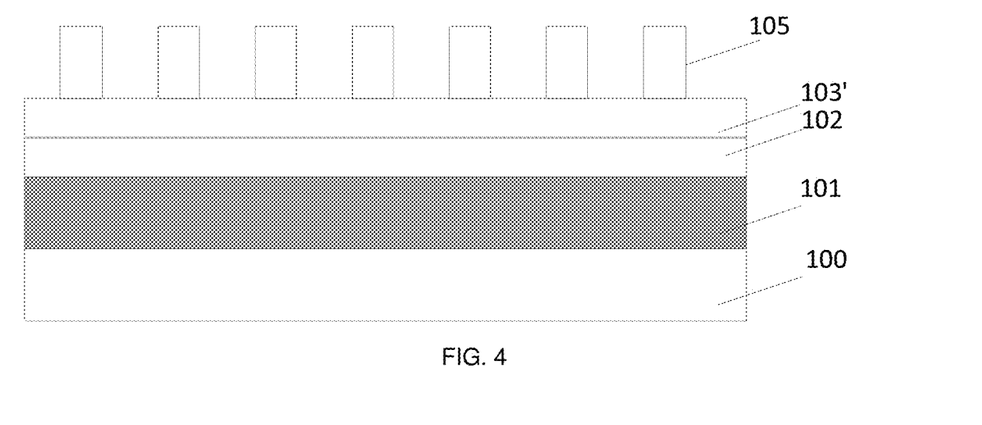

Patterning processing is performed on the initial word line layer 103' through self-aligned double patterning or self-aligned quadruple patterning, to obtain a plurality of small word lines 103 arranged at intervals. Self-aligned double patterning includes: forming a first photoresist layer 104 on the initial word line layer 103'. Referring to FIG. 2, a material of the first photoresist layer 104 may be silicon oxide. A dielectric material is deposited on a surface of the first photoresist layer 104 and the surface of the initial word line layer 103'. Referring to FIG. 3, the dielectric material may be, for example, silicon nitride. The dielectric material on an upper surface of the first photoresist layer 104 and the dielectric material on the surface of the initial word line layer 103' are removed, and the dielectric material on a sidewall of the first photoresist layer 104 is retained. Then, the first photoresist layer 104 may be removed by using a hydrofluoric acid solution, thereby forming a first mask layer 105, as shown in FIG. 4.

Figure 5:
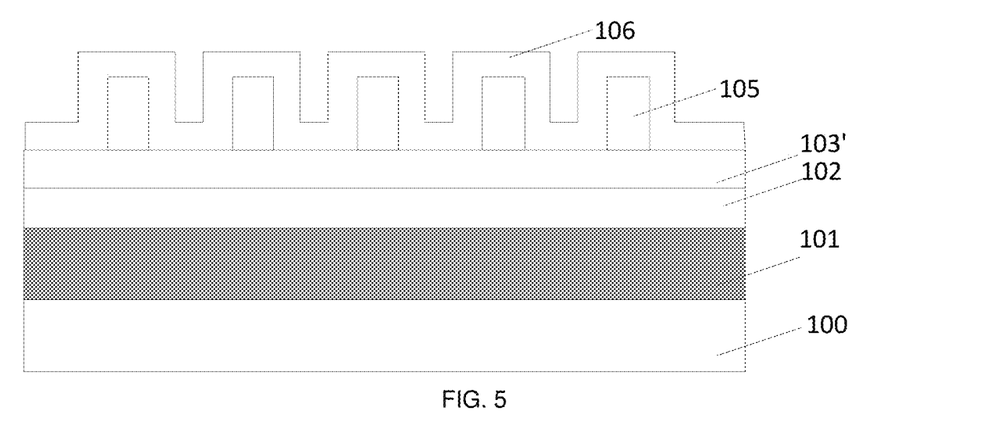
Figure 6:
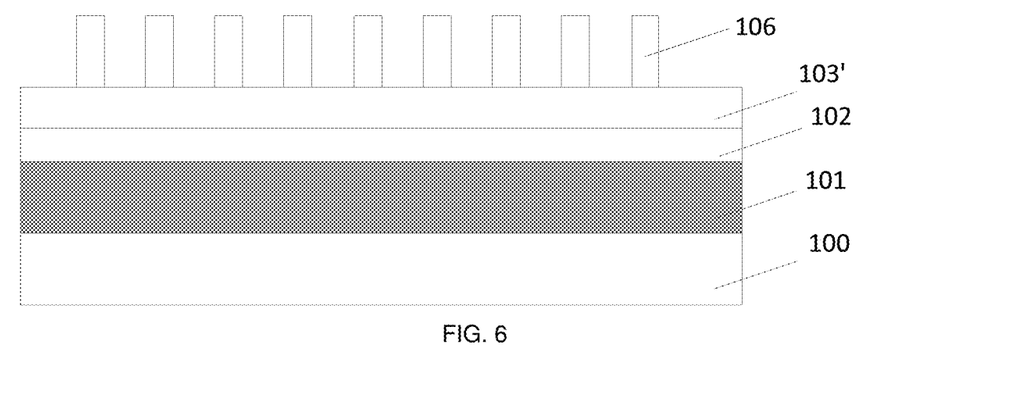
Figure 7:
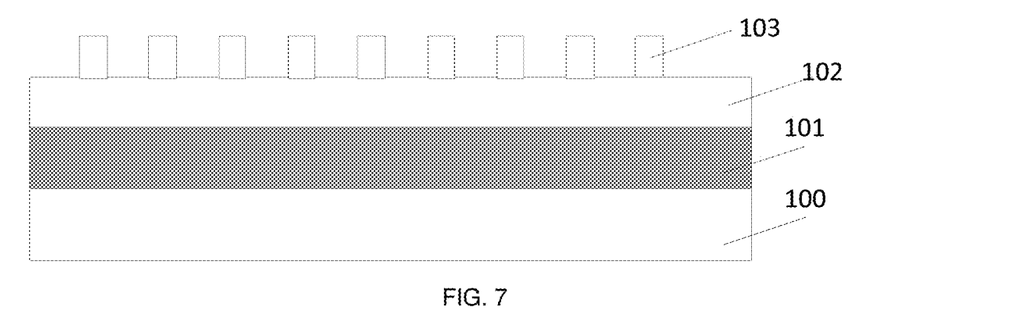

Self-aligned quadruple patterning is a technique of performing self-aligned double patterning twice, to obtain smaller word lines 103. Specifically, a dielectric material is deposited on a surface of the first mask layer 105 and the surface of the initial word line layer 103', and the dielectric material may be silicon oxide, as shown in FIG. 5. The dielectric material on the surface of the first mask layer 105 and the dielectric material on the surface of the initial word line layer 103' are removed, the dielectric material on a sidewall of the first mask layer 105 is retained, and the first mask layer 105 is removed by using a phosphoric acid solution, so that a second mask layer 106 is formed on the initial word line layer 103', as shown in FIG. 6. In this way, the formed second mask layer 106 is small. The initial word line layer 103' is etched with the second mask layer 106 as a shield, thereby forming a plurality of small word lines 103 on the isolation layer 102, as shown in FIG. 7, to improve the device storage density.

Figure 8:
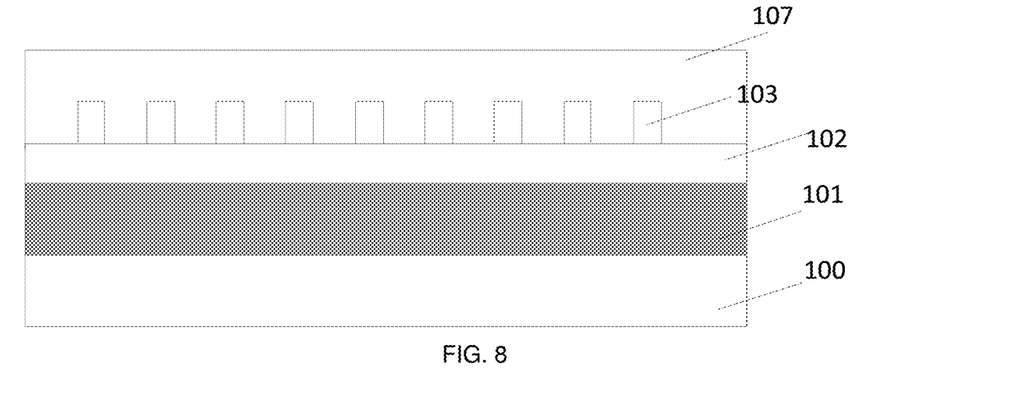
Figure 9:
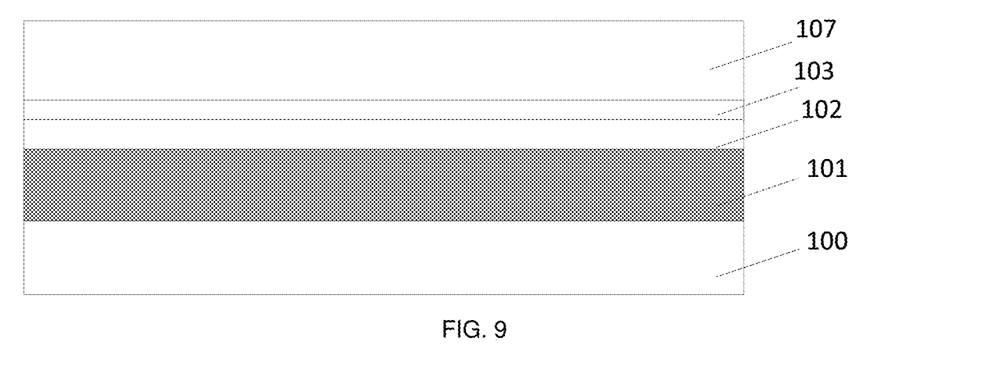

Subsequently, a dielectric material is deposited on a surface of the word line 103 to form a capping layer 107. Referring to FIG. 8 and FIG. 9, FIG. 8 is a schematic structural cross-sectional diagram in the first direction, and FIG. 9 is a schematic structural cross-sectional diagram in the second direction. The first direction and the second direction are perpendicular to each other. A thickness of the capping layer 107 is larger than a size of the word line 103 in a direction perpendicular to the substrate, so as to protect the word line 103.

Figure 10:
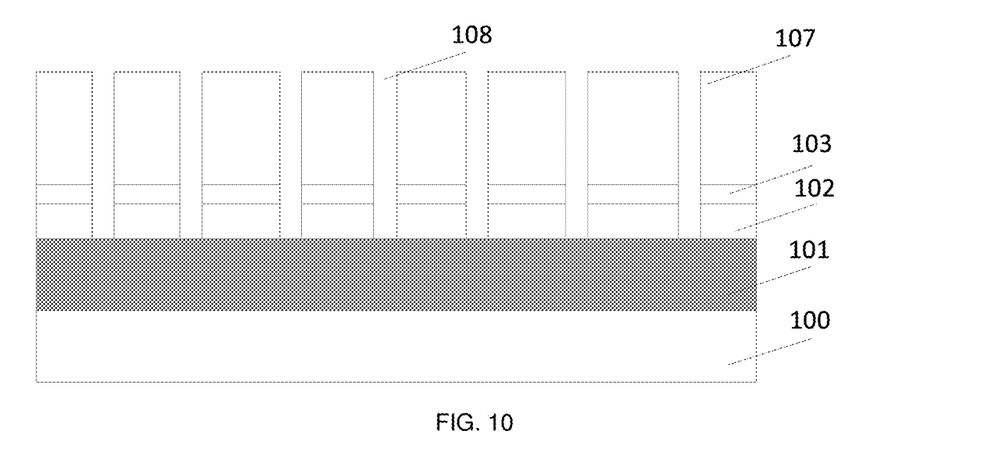

For example, the capping layer 107, the word line 103, and the isolation layer 102 are etched to reach the source plate 101 by means of reactive ion etching, so as to form a plurality of channel holes 108 penetrating through the capping layer 107, the word line 103, and the isolation layer 102 to reach the source plate 101, as shown in FIG. 10. The channel hole 108 may be located on the source plate 101 or in the source plate 101.

Figure 11:
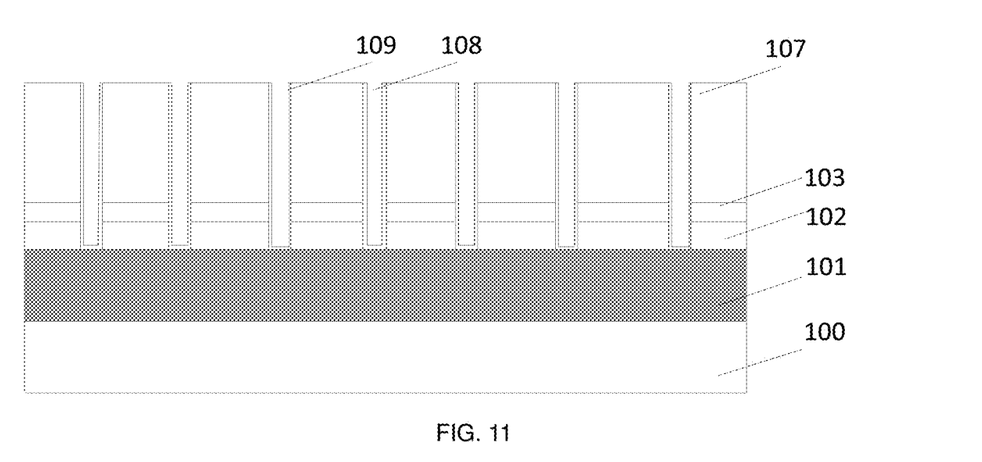

In the channel hole 108, a high-k dielectric material such as Hafnium dioxide ($HfO_2$), Zirconium dioxide ($ZrO_2$), or Hafnium oxynitride (HfON) is deposited, for example, by means of ALD, to form a gate oxide layer 109 on a sidewall of the channel hole 108, as shown in FIG. 11. The channel hole 108 is filled with an oxide semiconductor material, such as indium gallium zinc oxide, and then planarized to form a channel 110, as shown in FIG. 12.

Then, a drain electrode 111 is formed on the channel 110, as shown in FIG. 13. Each channel 110 has a corresponding drain electrode 111. A method for forming the drain electrode 111 may be as follows: removing a part of the oxide semiconductor material at the top of the channel 110, to form a groove in the channel 110, and filling the groove with a conductive material, to form the drain electrode 111. A method for forming the drain electrode 111 may also be: depositing a conductive material on the channel 110 and the capping layer 107, and then removing the conductive material on the capping layer 107, to form the drain electrode 111 on the channel 110. Alternatively, a resistance of a part of the oxide semiconductor material on the top of the channel 110 can be reduced through doping, ion implantation, plasma treatment, metal induction, or the like, to form the drain electrode 111 on the channel 110.

A channel 110, a word line 103 of the channel 110, the source plate 101, and the drain electrode 111 on the channel 110 form a vertical transistor. The word line 103 of the channel is a gate electrode of the vertical transistor. Since a plurality of word lines 103 are formed on the source plate 101 and a plurality of channels 110 are formed in one word line 103, a plurality of vertical transistors can be formed on the substrate 100. A plurality of channels 110 share the source plate 101. In the direction perpendicular to the substrate 100, sizes of the plurality of channels 110 are the same, and drain electrodes on the channels 110 are also the same, so that upper ends of the plurality of vertical transistors are on the same horizontal plane. Therefore, a plurality of vertical transistors arranged in an aligned manner are formed on the substrate 100.

S102: Form a plurality of staggered contact pads 112 connected to upper ends of the vertical transistors, where a single contact pad 112 is connected to upper ends of an even number of vertical transistors, as shown in FIG. 14 and FIG. 15.

A metal material is deposited on the capping layer 107, and patterning processing is performed on the deposited metal material to form a plurality of contact pads 112. Since upper ends of the vertical transistors are arranged in an aligned manner, the contact pads 112 effectively connect the plurality of vertical transistors together. The plurality of contact pads 112 are arranged in a staggered manner to avoid contact between adjacent contact pads. For example, a plurality of columns of contact pads are formed in a direction in parallel with the substrate 100, and contact pads 112 in adjacent columns do not overlap with each other. A projection of the contact pad 112 on the surface of the substrate 100 covers those of the vertical transistors connected to the contact pad 112 on the surface of the substrate 100. For example, a projection of each contact pad 112 in each column on the surface of the substrate 100 covers those of the vertical transistors connected to the contact pad 112 on the surface of the substrate 100.

Each contact pad 112 is connected to upper ends of the even number of vertical transistors, that is, each contact pad 112 is connected to drain electrodes 111 of the even number of vertical transistors, so that a shape of the contact pad 112 is a relatively regular square, which reduces the possibility of contact between adjacent contact pads 112. A single contact pad 112 may be connected to at least two word lines through the even number of vertical transistors. For example, a single contact pad 112 is connected to upper ends of four vertical transistors. The single contact pad 112 is connected to two word lines through the four vertical transistors.

A direction in which the word line extends is referred to as a first direction. Vertical transistors connected to a same word line are connected to different contact pads 112, and adjacent contact pads 112 are located on two sides of the word line 103 in a staggered manner. Referring to a dashed area in FIG. 15, two contact pads 112 in a dashed area are referred to as a first contact pad 1121 and a second contact pad 1122, and two vertical transistors are referred to as a first vertical transistor 1201 and a second vertical transistor 1202. Then, the first vertical transistor 1201 is connected to the first contact pad 1121, the second vertical transistor 1202 is connected to the second contact pads 1122, and the first contact pad 1121 and the second contact pad 1122 are located on two sides of the word line 103 in a staggered manner. Projections of sides of adjacent staggered contact pads 112 on the word line 103 are located on a same straight line, which reduces a size of the contact pad 112 and costs.

S103: Form magnetic tunnel junctions 113 on the contact pads 112, as shown in FIG. 16 to FIG. 18.

A dielectric material such as an oxide is deposited on the contact pad 112 and the capping layer 107, to form a dielectric layer 118 covering the contact pad 112, and then a pinned layer 114, an insulating layer 115, and a free layer 116 are formed on the dielectric layer 118 in sequence. Referring to FIG. 16, the pinned layer 114 is in contact with an upper part of the contact pad 112.

Specifically, two directions in parallel with the substrate 100 are referred to as an X direction and a Y direction respectively, and a pinned layer plate, an insulating layer plate, and a free layer plate are formed on the dielectric layer 118 in sequence. Patterning processing is performed on the pinned layer plate, the insulating layer plate, and the free layer plate in the X direction and the Y direction to obtain the pinned layer 114, the insulating layer 115, and the free layer 116 that are stacked in sequence.

For example, a third photoresist layer is formed on the free layer plate, and the third photoresist layer includes a plurality of strip-shaped structures arranged at intervals in the X direction. A third mask layer is formed on a sidewall of the third photoresist layer, and the third photoresist layer is removed. The free layer plate, the insulating layer plate, and the pinned layer plate are etched to reach the contact pad 112 with the third mask layer as a shield, so that the free layer plate, the insulating layer plate, and the pinned layer plate include a plurality of strip-shaped structures in the X direction. The strip-shaped structures extend in the Y direction. The third mask layer is removed, and then a fourth photoresist layer is formed on each of the plurality of strip structures. The fourth photoresist layer includes a plurality of strip-shaped structures in the Y direction, and a size of the strip structure in the X direction is the same as that of the third mask layer in the X direction. A fourth mask layer is formed on a sidewall of the fourth photoresist layer, and the fourth photoresist layer is removed. The free layer plate, the insulating layer plate, and the pinned layer plate are etched to reach the contact pad 112 with the fourth mask layer as a shield, to form a magnetic tunnel junction on each contact pad 112, that is, the pinned layer 114, the insulating layer 115, and the free layer 116 that are stacked in sequence.

Referring to FIG. 17 and FIG. 18, to more clearly show the semiconductor structure of the present disclosure, the dielectric layer 118 is not shown in FIG. 17. A plurality of bit lines 117 may be formed on the magnetic tunnel junction 113 to alleviate the problem of a high resistance of buried bit lines. The extension direction of the word line 103 is referred to as a first direction, and the extension direction of the bit line 117 is referred to as a second direction. In this case, a plurality of bit lines 117 extending in the second direction are formed on the magnetic tunnel junction 113, each bit line 117 may be connected to a plurality of magnetic tunnel junctions 113, and the first direction and the second direction may be perpendicular to each other. Then, site selection is performed for the word line 103 and a voltage is applied to the bit line 117, and the magnetization direction of the free layer 116 is reversed by using the writing method of a spin transfer torque, so as to implement writing of the magnetoresistive random access memory.

In the semiconductor structure provided by the embodiments of the present disclosure, a plurality of vertical transistors arranged in an aligned manner are formed on the substrate, where the channel material of the vertical transistor includes an oxide semiconductor. A plurality of staggered contact pads connected to upper ends of the vertical transistors are formed at the upper ends of the vertical transistors, where a single contact pad is connected to upper ends of an even number of vertical transistors. Magnetic tunnel junctions are arranged on the contact pads. A plurality of vertical transistors are connected to one magnetic tunnel junction through the contact pad. One magnetic tunnel junction is driven by the plurality of vertical transistors, thereby increasing a drive current for driving the magnetic tunnel junction and effectively driving a memory array of a magnetoresistive random access memory.

At last, it should be noted that the above embodiments are only used for describing the technical solutions of the present disclosure, and are not intended to limit the present disclosure. Although the present disclosure is described in detail with reference to the above embodiments, those of ordinary skill in the art should understand that they can still make modifications to the technical solutions described in the above embodiments, or make equivalent substitutions for some or all technical features therein. However, these modifications or substitutions do not make the essence of the corresponding technical solutions depart from the scope of the technical solutions of the embodiments of the present disclosure.

The invention claimed is:

1. A semiconductor structure, comprising:
   a substrate;
   a plurality of vertical transistors arranged in an aligned manner on the substrate; wherein a channel material of the vertical transistors comprises indium gallium zinc oxide;
   a plurality of staggered contact pads connected to upper ends of the vertical transistors, wherein a single one of the staggered contact pads is connected to upper ends of an even number of the vertical transistors and a projection of the staggered contact pads on a surface of the substrate covers projections of the vertical transistors connected to the staggered contact pads on the surface of the substrate; and
   a magnetic tunnel junction is arranged on the single one of the staggered contact pads.

2. The semiconductor structure according to claim 1, further comprising:
   a plurality of word lines arranged at intervals, wherein the single one of the staggered contact pads is connected to at least two of the word lines through the even number of the vertical transistors.

3. The semiconductor structure according to claim 2, wherein the single one of the staggered contact pads is connected to upper ends of four of the vertical transistors.

4. The semiconductor structure according to claim 3, wherein the single one of the staggered contact pads is connected to two of the word lines through the four of the vertical transistors.

5. The semiconductor structure according to claim 4, wherein each of the word lines extends along a first direction; and
   the vertical transistors connected to a same word line in said plurality of word lines are connected to different ones of the staggered contact pads, and adjacent ones of the staggered contact pads are arranged on two sides of ones of the word lines in a staggered manner.

6. The semiconductor structure according to claim 5, wherein projections of sides of the adjacent ones of staggered contact pads on the word line are located on a same straight line.

7. The semiconductor structure according to claim 5, further comprising:
   a plurality of bit lines extending along a second direction, wherein each of the bit lines is connected to a plurality of the magnetic tunnel junctions, and the second direction is perpendicular to the first direction.

\* \* \* \* \*